(12) United States Patent
Takenaka

(10) Patent No.: US 7,455,423 B2
(45) Date of Patent: Nov. 25, 2008

(54) SEMICONDUCTOR LIGHT EMITTING DEVICE

(75) Inventor: Yasuji Takenaka, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 264 days.

(21) Appl. No.: 11/414,047

(22) Filed: Apr. 27, 2006

(65) Prior Publication Data

US 2006/0245188 A1 Nov. 2, 2006

(30) Foreign Application Priority Data

Apr. 28, 2005 (JP) ............................. 2005-132334

(51) Int. Cl.
 *H01L 33/00* (2006.01)
(52) U.S. Cl. ................. 362/231; 362/252; 257/98; 257/E33.059; 257/E33.061
(58) Field of Classification Search ................. 362/231, 362/249, 235, 252, 800; 257/98, 99, 100, 257/E33.056, E33.058, E33.059, E33.061
See application file for complete search history.

(56) References Cited

U.S. PATENT DOCUMENTS

| | | | |
|---|---|---|---|
| 6,069,440 A * | 5/2000 | Shimizu et al. ............. | 313/486 |
| 6,355,946 B1 | 3/2002 | Ishinaga | |
| 6,495,861 B1 | 12/2002 | Ishinaga | |
| 6,608,332 B2 * | 8/2003 | Shimizu et al. ............... | 257/98 |
| 7,066,626 B2 * | 6/2006 | Omata ......................... | 362/257 |
| 7,106,276 B2 * | 9/2006 | Akiyama ...................... | 345/39 |
| 7,220,039 B2 * | 5/2007 | Ahn et al. .................... | 362/612 |
| 2002/0175632 A1 * | 11/2002 | Takeguchi ................. | 315/169.1 |
| 2004/0201987 A1 | 10/2004 | Omata | |

FOREIGN PATENT DOCUMENTS

| | | |
|---|---|---|
| CN | 1423345 A | 6/2003 |
| CN | 1490650 A | 4/2004 |
| CN | 1538538 A | 10/2004 |
| JP | 08-153895 A | 6/1996 |
| JP | 2000-049384 A | 2/2000 |
| JP | 2000-183407 A | 6/2000 |
| JP | 2000-269551 A | 9/2000 |
| JP | 2000-294838 A | 10/2000 |
| JP | 2002-368279 A | 12/2002 |
| JP | 2004-327955 A | 11/2004 |
| JP | 2005-39104 | 2/2005 |

OTHER PUBLICATIONS

Chinese Office Action, dated Mar. 28, 2008, directed to counterpart Foreign Application No. CN-200610074602.7; 16 pages.

* cited by examiner

*Primary Examiner*—Thomas M Sember
(74) *Attorney, Agent, or Firm*—Morrison & Foerster LLP

(57) ABSTRACT

A semiconductor light emitting device of the present invention includes four elements provided on a substrate and having different light emitting colors of red, green, blue, and white, respectively; a resin covering each of the elements; and a reflector provided to surround a circumference of the resin. With this structure, a semiconductor light emitting device having high brightness and excellent color rendering properties can be provided.

8 Claims, 4 Drawing Sheets

SEMICONDUCTOR LIGHT EMITTING DEVICE

CROSS-REFERENCE TO RELATED APPLICATIONS

This nonprovisional application is based on and claims priority to Japanese Patent Application No. 2005-132334 filed with the Japan Patent Office on Apr. 28, 2005, the entire contents of which are hereby incorporated by reference.

BACKGROUND OF THE INVENTION

1. Field of the Invention

The present invention relates to a semiconductor light emitting device using a light emitting element such as a light emitting diode (LED).

2. Description of the Background Art

A semiconductor light emitting device of this kind is disclosed for example in Japanese Patent Laying-Open No. 2000-269551.

This conventional device typically has a structure of a surface mounted LED as shown in FIG. 12. In this conventional structure, a resin b to fix a lead frame a is formed by insert molding or the like. On lead frame a, an LED chip c is electrically and mechanically connected by means of an Ag paste f and a gold wire d. The circumference of LED chip c is protected and sealed with an epoxy resin e.

In this conventional semiconductor light emitting device, lead frame a is formed to have a designated pattern shape, plated with Ag, and then insert molded into resin b. On lead frame a, LED chip c is electrically and mechanically connected by means of Ag paste f and gold wire d. Then, LED chip c is sealed with epoxy resin e or a silicon resin. After an unnecessary lead portion is cut, lead frame a is bent into a U shape, and thus a terminal portion for joining with a mounting board is formed.

Examples of such a semiconductor light emitting device include a device having one or a plurality of LEDs emitting light in a single color such as red, blue, or yellow, or emitting white light generated by exciting a blue LED with a fluorescent substance (for example, a device having two red LEDs); and a device of RGB (red, green, and blue) light emitting type in which three LEDs emitting light in each of three primary colors (a red LED, a green LED, and a blue LED) are mounted into one product (for example, see Japanese Patent Laying-Open No. 08-153895).

Of the conventional devices as shown in FIG. 12, the device having a plurality of LEDs of white light emitting type each formed by exciting a fluorescent substance with blue LEDs, and the device of so-called RGB light emitting type having three LEDs emitting light in each of three primary colors (a red LED, a green LED, and a blue LED) are often mounted mainly in a light source for a supplementary light of a CCD (charge-coupled device), or in a light source for backlighting liquid crystal. Since each of these conventional devices has advantages and disadvantages as described below, it has been difficult to produce an LED having high brightness and excellent color rendering properties.

(1) The device having LEDs of white light emitting type each formed by exciting a fluorescent substance with blue LEDs:

The device of this type features good light emission and conversion efficiency, and it can obtain high brightness easier than the device of RGB light emitting type which generates white light by combining the three primary colors (red, green, and blue). At the same time, since the device of this type generates white light in a pseudo manner in combination with a yellowish green component generated by exciting a fluorescent substance with blue LEDs, it contains almost no red component. As a result, the device having LEDs of white light emitting type has poor color rendering properties, and in particular it cannot provide bright red color.

Although some fluorescent substances allow the device of this type to have a red component, using such a fluorescent substance to achieve the above effect involves poor efficiency. Accordingly, further improvement is required for practical use. Furthermore, since the device having LEDs of white light emitting type cannot display individual colors such as blue, green, and the like, its application is limited.

(2) The device of RGB light emitting type having LEDs emitting light in each of the three primary colors (a red LED, a green LED, and a blue LED):

Since the device of this type contains three primary color components, it has excellent color rendering properties. Thereby, it can in particular provide bright red color when used for shooting with a CCD, backlighting liquid crystal, or the like. Further, since the device of this type has a red LED, a green LED, and a blue LED individually, color balance can be adjusted. As a result, the device of this type can reproduce individual colors and generate various colors, and thus it is also excellent as an illumination. However, when compared with the device having LEDs of white light emitting type each formed by exciting a blue LED with a fluorescent substance, it is difficult for the device of this type to achieve brightness due to a problem in individual light emission efficiency.

SUMMARY OF THE INVENTION

One object of the present invention is to provide a semiconductor light emitting device having high brightness and excellent color rendering properties.

To achieve the foregoing object, the semiconductor light emitting device of the present invention includes four elements provided on a substrate and having different light emitting colors of red, green, blue, and white, respectively; a resin covering each of the elements; and a reflector provided to surround a circumference of the resin.

According to the present invention, a semiconductor light emitting device having high brightness and excellent color rendering properties can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
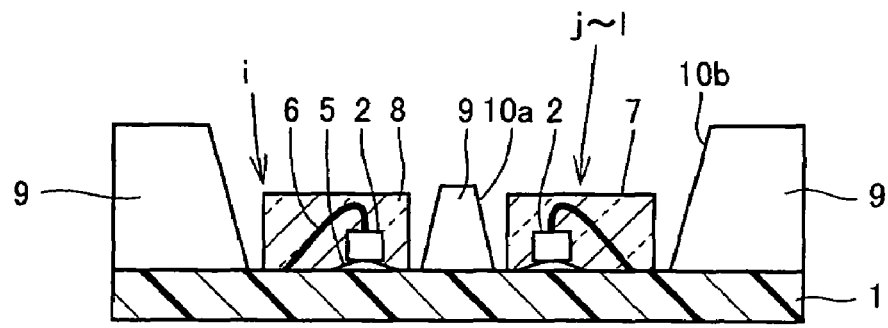
FIG. 1 is a cross sectional view of a semiconductor light emitting device showing an embodiment of the present invention.

Referring to the drawings, embodiments of the present invention will be described.

Figure 2:
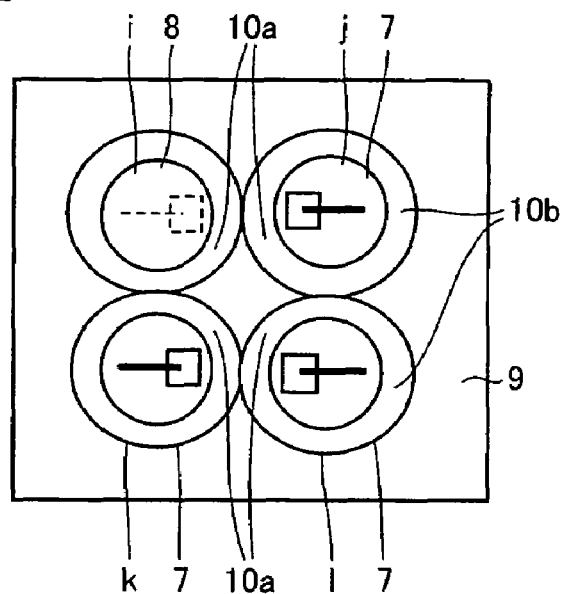
FIG. 2 is a plan view of the semiconductor light emitting device shown in FIG. 1.

FIGS. 1 and 2 are a cross sectional view and a plan view, respectively, of a surface mounted LED showing an embodiment of a semiconductor light emitting device of the present invention.

The semiconductor light emitting device has a substrate 1 with a terminal (not shown) formed thereon for electrically connecting substrate 1 with an external interconnection. On substrate 1 are provided elements 2 emitting light in four different colors. The four different colors include red, green, blue, and white. Element 2 is formed of a light emitting diode element (hereinafter, element 2 will also be referred to as an "LED chip").

On the surface of substrate 1 is formed pattern interconnection electrically connecting an electrode of each element 2 with the terminal (not shown), and LED chip 2 is mounted thereon. Specifically, LED chip 2 is electrically and mechanically connected with substrate 1 by means of an Ag paste 5 and a gold wire 6.

In FIG. 2, a white light emitting portion is indicated by i, a blue light emitting portion is indicated by j, a red light emitting portion is indicated by k, and a green light emitting portion is indicated by l (these reference characters i, j, k, and l indicate like elements throughout the drawings described below).

Each element 2 is covered with a resin. The light emitting portions other than white light emitting portion i are sealed with a transparent or opalescent epoxy or silicon resin 7. In white light emitting portion i, blue or ultraviolet LED 2 is mounted and sealed with an epoxy or silicon resin 8 containing a fluorescent substance.

Although resins 7 and 8 basically have a substantially flat surface, they can also have a surface in the shape of a convex lens, a concave lens, or the like.

Further, particularly when gold wire 6 is formed as an inverse wire, epoxy or silicon resin 8 containing a fluorescent substance can have a reduced height, and the amount of the resin used and the amount of the fluorescent substance contained can be reduced and optimized, obtaining efficient white light emission. It is to be noted that an inverse wire refers to an interconnection structure between a substrate and an electrode on the surface side of a light emitting element, as shown in FIG. 1 of Japanese Patent Laying-Open No. 2000-049384. Specifically, unlike the embodiment of the present invention shown in FIG. 1, in the technique of forming an inverse wire, a gold ball is formed on a substrate, ball bonding is performed between the gold ball and a gold wire, and wedge bonding is performed between the gold wire and a surface side electrode of a light emitting element.

Furthermore, when an LED element using AuSn or Sn as a material constituting a backside electrode is used as LED chip 2, it is also possible to join LED chip 2 with a substrate pattern portion without using Ag paste 5, by means of eutectic bonding between a metal constituting the backside electrode and metal plating of Au, Ag or the like formed on the substrate pattern portion. Such junction is particularly effective when it is desired to secure junction strength or to release heat generated from LED chip 2 efficiently to a lower surface.

A reflector 9 is provided to surround the circumferences of resins 7 and 8. Reflector 9 has a reflecting surface 10 which is subjected to metal plating or metal vapor deposition.

Reflector 9 is formed to surround each of the four elements 2. Specifically, reflector 9 is formed for each element emitting light in each color, and reflecting surface 10 is formed at an angle effective for each element. By providing reflector 9 for each element, the distance between each of the four elements 2 and reflecting surface 10 can be set optimally, allowing light to be emitted to the front efficiently. Further, a surface apart at a predetermined distance can efficiently be irradiated with light from each element, and color mixture can also be performed with ease.

Although reflecting surface 10 may be formed of a white resin having high reflectivity, higher reflectivity can be obtained by means of metal plating or metal vapor deposition, achieving higher brightness. In addition, when it is desired to further improve color mixing property even at a position other than the irradiated surface apart at the predetermined distance, it is also effective to lower a reflecting surface 10a between the elements emitting light in the respective colors than a circumferential reflecting surface 10b.

Figure 3:
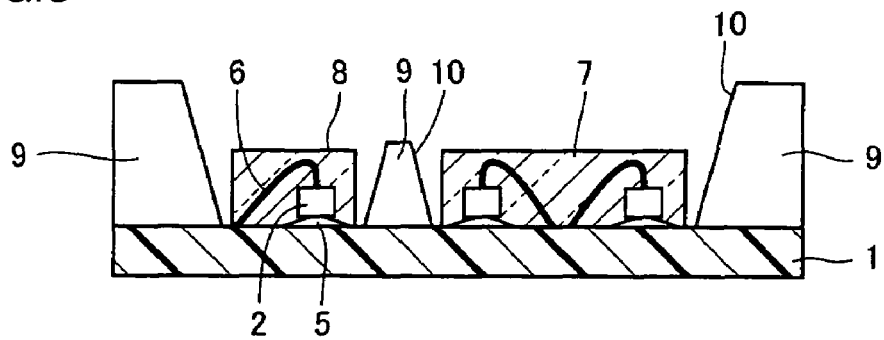
FIG. 3 is a cross sectional view of a semiconductor light emitting device showing another embodiment of the present invention.
Figure 4:
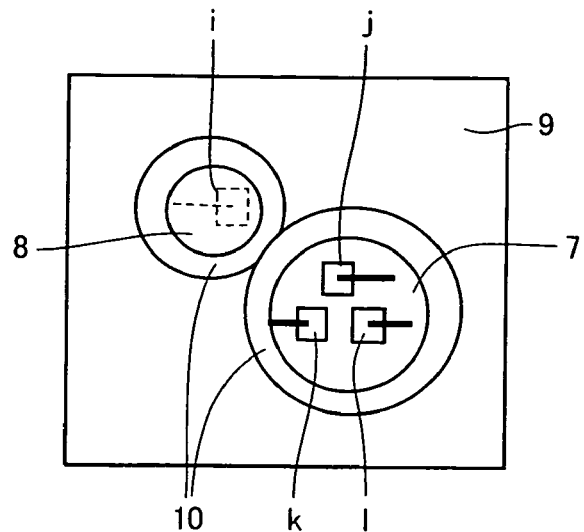
FIG. 4 is a plan view of the semiconductor light emitting device shown in FIG. 3.

FIGS. 3 and 4 show a semiconductor light emitting device in another embodiment of the present invention. In the present embodiment, reflector 9 is formed to surround elements 2 respectively emitting red, blue, and green light as one group, and to surround element 2 emitting white light as another group.

Although the device in the present embodiment has a basic technical idea common to the device shown in FIGS. 1 and 2, it differs from the device in the embodiment shown in FIGS. 1 and 2 in that reflector 9 separately surrounds white light emitting element 2 as one group and RGB light emitting elements 2 as another group.

Since RGB light emitting elements 2 are formed as a group in the present embodiment, the distance from each RGB light emitting element 2 to reflecting surface 10 differs with each other. As a result, a light axis is slightly deviated when light is emitted to the front, and efficiency in each of RGB light emitting elements 2 is reduced. However, color mixing property is significantly improved particularly when the LEDs are seen directly or even at a position other than the irradiated surface apart at the predetermined distance. Further, a smaller sized product can be created more easily when compared with the device in the embodiment shown in FIGS. 1 and 2.

The semiconductor light emitting device in the present embodiment firstly causes white LED chip 2 to emit light to obtain predetermined brightness, and adjusts the brightness of red, green, and blue LED chips 2 to obtain a predetermined color tone. Thereby, the semiconductor light emitting device can have high brightness and excellent color rendering properties.

Figure 5:
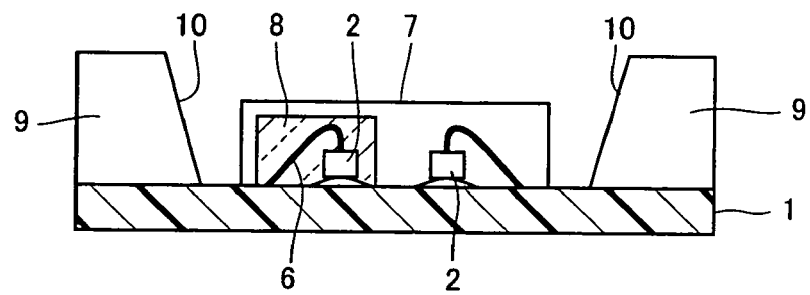
FIG. 5 is a cross sectional view of a semiconductor light emitting device showing still another embodiment of the present invention.
Figure 6:
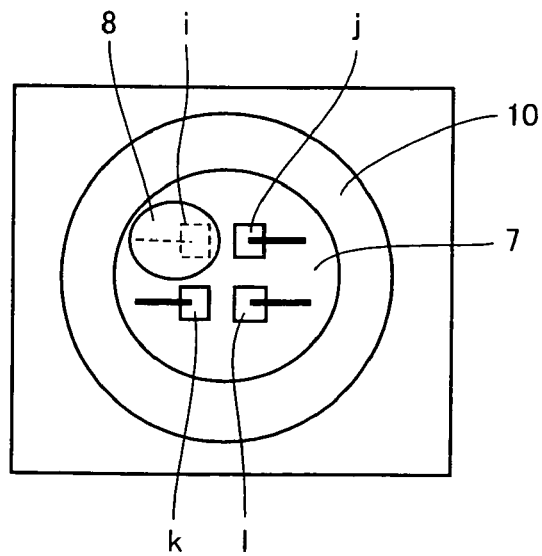
FIG. 6 is a plan view of the semiconductor light emitting device shown in FIG. 5.

FIGS. 5 and 6 show a semiconductor light emitting device in still another embodiment of the present invention. In the present embodiment, reflector 9 is formed to surround all of elements 2 respectively emitting red, green, blue, and white light as one group.

The semiconductor light emitting device in the present embodiment is an example of a surface mounted LED, and all of elements 2 respectively emitting red, green, blue, and white light are surrounded by one reflecting surface 10.

Since this device has a characteristic that all elements 2 are formed as one group, the distance from each element 2 to reflecting surface 10 differs with each other. As a result, a light axis is slightly deviated when light is emitted to the front, and efficiency in each element 2 is reduced. However, color mixing property is significantly improved particularly when the LEDs are seen directly or even at a position other than the irradiated surface apart at the predetermined distance.

Unlike the device shown in FIG. 3, in the device of the present embodiment shown in FIGS. 5 and 6, all elements 2 including the one emitting white light are formed as one group. Accordingly, the device of the present embodiment has an effect of obscuring uneven light emission (poor color mixing property) from the red, green, and blue light emitting portions when white light is emitted. In addition, with the device of the present embodiment, further smaller sized product can be created when compared with the device in the embodiment shown in FIG. 3.

Although epoxy or silicon resin 8 containing a fluorescent substance is further covered with epoxy or silicon resin 7 in the present embodiment, it is also possible to employ a structure in which resin 8 is not covered with resin 7 and respective elements 2 are individually covered with resins 7 or 8 inside reflector 9.

Figure 7:
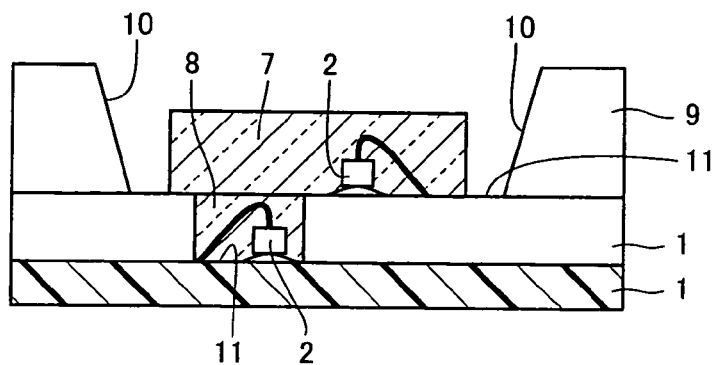
FIG. 7 is a cross sectional view of a semiconductor light emitting device showing still another embodiment of the present invention.
Figure 8:
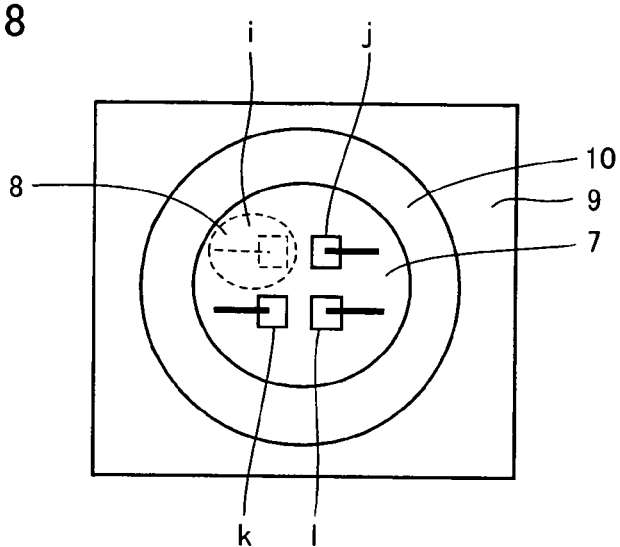
FIG. 8 is a plan view of the semiconductor light emitting device shown in FIG. 7.

FIGS. 7 and 8 show a semiconductor light emitting device in another embodiment of the present invention, wherein substrate 1 has a placement surface 11 on which elements 2 are placed and which has a two-stage structure. White light emitting element 2 is placed on a stage different from a stage on which RGB light emitting elements 2 are placed. In the present embodiment, white light emitting element 2 is placed on a lower stage, and RGB light emitting elements 2 are placed on an upper stage.

For the device of the type in which all elements 2 are formed as one group, it is desirable to employ a structure as shown in FIG. 7.

Specifically, substrate 1 has a two-stage structure, and blue or ultraviolet LED chip 2 is mounted on a lower stage and sealed with epoxy or silicon resin 8 containing a fluorescent substance. The remaining RGB light emitting elements 2 are mounted on an upper stage of substrate 1.

With this structure, epoxy or silicon resin 8 containing a fluorescent substance can easily provide sealing by means of potting, and it can obtain a stable shape. Further, sealing element 2 with transparent or opalescent epoxy or silicon resin 7 can be performed easily.

Furthermore, since epoxy or silicon resin 8 containing a fluorescent substance is hidden in the lower stage, it does not cast a shadow when RGB light emission is performed. Accordingly, light can be emitted efficiently.

It is also possible to place blue and green light emitting elements on a stage different from a stage on which red and white light emitting elements are placed.

Figure 9:
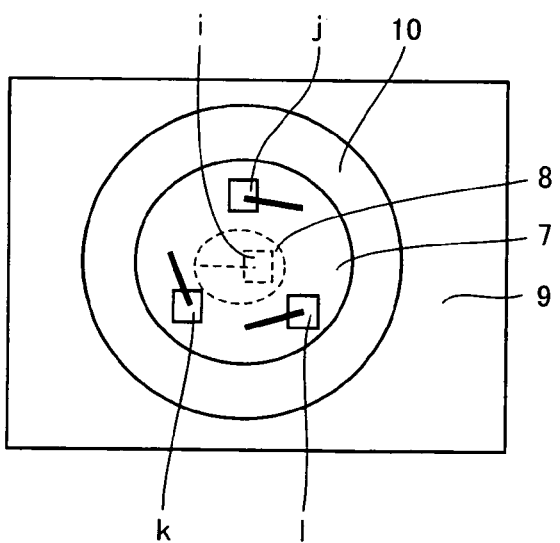
FIG. 9 is a plan view of a semiconductor light emitting device showing still another embodiment of the present invention.

FIG. 9 shows a semiconductor light emitting device in another embodiment of the present invention, wherein white light emitting element 2 is placed at the center of substrate 1 and red, blue, and green light emitting elements 2 are placed to surround white light emitting element 2.

In the present embodiment, if color mixing property is further considered as important, it is desirable to place white light emitting element 2 at the center and place red, blue, and green light emitting elements 2 at positions of the apexes of a substantially regular triangle.

It is to be noted that, when the present technique is employed, it is effective to place red LED chip 2 also on the lower stage.

While blue and green LED chips 2 have a height of about 100 μm, red LED chip 2 has a greater height of about 300 μm. Accordingly, when these LED chips 2 are placed on the same stage, red LED chip 2 may cast a shadow when blue light and green light are emitted, resulting in a reduction in light emission efficiency. By placing red LED chip 2 also on the lower stage, the above problem is solved and an efficient light emitting device can be provided. Specifically, higher brightness can be obtained by placing an LED chip with a greater height on the lower stage to prevent it from blocking a path of light emitted from an LED chip with a lower height.

It is desirable that the lower stage has a height which is high enough to seal element 2 in white light emitting portion i and lower than the height of a light emitting layer of red LED chip 2. The present technique is also effective when green light is excited with a fluorescent substance.

Figure 10:
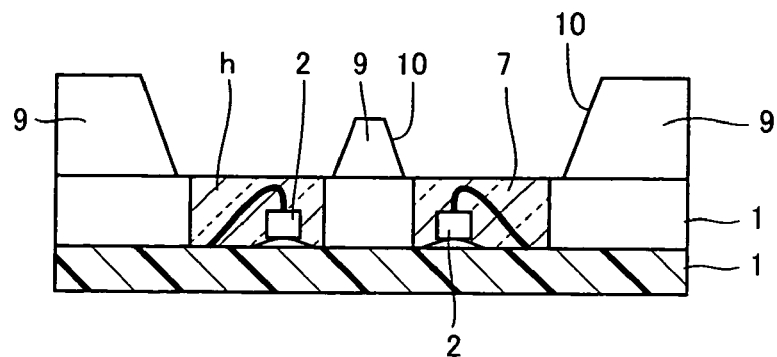
FIG. 10 is a cross sectional view of a semiconductor light emitting device showing still another embodiment of the present invention.

For the devices in all the embodiments described above, it is of course possible to form substrate 1 as a two-stage structure and place all chips 2 on the lower stage, as shown in FIG. 10. Although the size of a product is slightly increased, sealing with a resin can easily be performed and stabilized, simplifying the manufacturing process.

Figure 11:
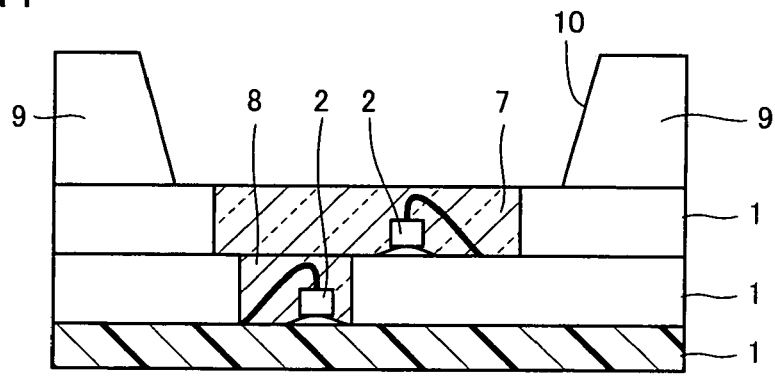
FIG. 11 is a cross sectional view of a semiconductor light emitting device showing still another embodiment of the present invention.
Figure 12:
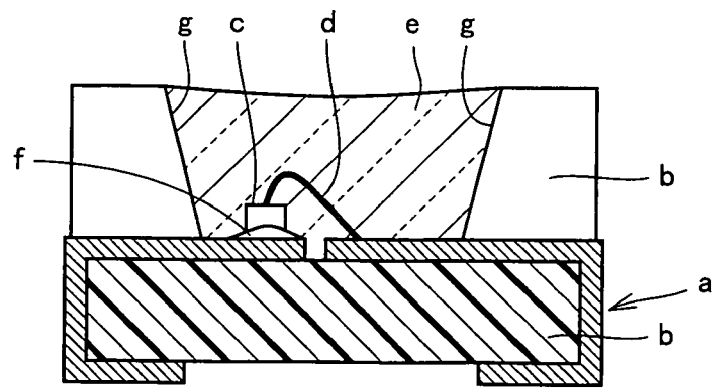
FIG. 12 is a cross sectional view showing a semiconductor light emitting device employing a conventional technique.

Further, by forming substrate 1 as a three-stage structure, placing a required combination of elements 2 on each of lower and middle stages, and forming the third stage as a dam for a sealing resin as shown in FIG. 11, sealing with the resin can further be performed easily and stabilized, and the manufacturing process can further be simplified in the semiconductor light emitting device in the embodiment shown in FIG. 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device, comprising:
   a substrate;
   a white light emitting portion comprising a light emitting element provided on said substrate and emitting at least one of a blue or ultraviolet light and a first resin comprising a fluorescent substance arranged to cover the light emitting element;
   three additional elements provided on said substrate and emitting light in colors of red, green, and blue, respectively;
   a second resin covering each of said additional elements; and
   a reflector provided to surround a circumference of the second resin,
   wherein the white light emitting portion is placed on a placement surface of the substrate at a lower stage than the three additional elements or is shielded by the reflector, such that light from the element emitting blue light is prevented from entering the white light emitting portion.

2. The semiconductor light emitting device according to claim 1, wherein a reflecting surface of said reflector is subjected to metal plating or metal vapor deposition.

3. The semiconductor light emitting device according to claim 1, wherein the reflector is formed to surround each of said four elements.

4. The semiconductor light emitting device according to claim 1, wherein said reflector is formed to surround said elements respectively emitting red, blue, and green light as one group, and surround said white light emitting portion as another group.

5. The semiconductor light emitting device according to claim 1, wherein said substrate includes the placement surface on which said elements are placed, the placement surface having a two-stage structure, and said white light emitting portion is placed on a stage different from a stage on which said elements respectively emitting red, blue, and green light are placed.

6. The semiconductor light emitting device according to claim 1, wherein said substrate includes the placement surface on which said elements are placed, the placement surface having a two-stage structure, and said elements respectively emitting blue and green light are placed on a stage different from a stage on which said elements red light and said white light emitting portion are placed.

7. The semiconductor light emitting device according to claim 1, wherein said white light emitting portion is placed at a center of said substrate, and said elements respectively emitting red, blue, and green light are placed to surround the white light emitting portion.

8. The semiconductor light emitting device according to claim 7, wherein said elements respectively emitting red, blue, and green light are placed at positions of apexes of a substantially regular triangle.

* * * * *